(12) United States Patent
Pobanz

(10) Patent No.: US 7,010,008 B2
(45) Date of Patent: Mar. 7, 2006

(54) FAST HIGH-SWING MODULATOR DRIVER CIRCUIT

(75) Inventor: Carl W. Pobanz, Topanga, CA (US)

(73) Assignee: Inphi Corporation, Westlake Village, CA (US)

( * ) Notice: Subject to any disclaimer, the term of this patent is extended or adjusted under 35 U.S.C. 154(b) by 125 days.

(21) Appl. No.: 10/748,506

(22) Filed: Dec. 29, 2003

(65) Prior Publication Data

US 2005/0147136 A1 Jul. 7, 2005

(51) Int. Cl.
*H01S 3/10* (2006.01)
*H01S 3/00* (2006.01)
*H03K 5/22* (2006.01)

(52) U.S. Cl. .................. 372/38.02; 372/26; 327/65
(58) Field of Classification Search ............. 372/38.02; 327/65

See application file for complete search history.

(56) References Cited

*Primary Examiner*—Armando Rodriguez
(74) *Attorney, Agent, or Firm*—Koppel, Jacobs, Patrick & Heybl

(57) ABSTRACT

A fast, high-swing driver circuit for driving an electro-optical modulator includes an output stage comprising first and second transistors arranged as a differential pair. The collector of the first transistor is coupled to ground, and its base provides the stage's input. The collector of the second transistor is coupled via an impedance to a supply voltage, and provides the stage's output. A reference voltage is provided to the second transistor's base, which is also AC-coupled to ground. A bias generator provides the second transistor's base voltage, and a second differential pair converts a differential input signal to a single-ended output that drives the output stage's input—preferably via a pair of cascaded emitter-follower stages that serve to present a low impedance. A complete electro-optical modulator driver is formed with the addition of a bias-T network at the output stage's output.

22 Claims, 4 Drawing Sheets

FAST HIGH-SWING MODULATOR DRIVER CIRCUIT

BACKGROUND OF THE INVENTION

1. Field of the Invention

This invention relates to the field of electro-optical modulator driver circuits, and particularly to modulator driver circuits requiring a high output voltage swing and high speed.

2. Description of the Related Art

Fiber optic cables are often driven by means of a continuous laser modulated by an electro-optical modulator. One such modulator that is often used in high-bit-rate (~10 Gb/s or more) communication systems is the Mach-Zehnder (MZ) modulator. MZ modulators use an optical interferometer fabricated in nonlinear material—e.g. Lithium Niobate, in which the velocity of light can be varied by an applied, electric field—to either block or transmit laser light as a function of an externally applied driving voltage. This voltage is either applied to a single input ("single-ended" drive) or is applied differentially at two inputs (in a "dual-drive" MZ modulator). The dual-drive modulator uses less voltage per input, but its two input signals require precise amplitude and phase matching which adds to system complexity. The single-ended MZ modulator is therefore more widely used today.

Due to the weakness of electro-optic effects, MZ modulators require a substantial driving voltage ("V pi")—typically 6–8 volts p—p for single-ended drive—to create high-quality light pulses at data rates of 10 Gb/s or more. However, data signals produced by digital circuits such as multiplexers are of relatively small amplitude, e.g. 200 millivolts. Thus it is necessary to provide a modulator driver that amplifies the data signal up to the required voltage. Since the modulator operates at the full serial data rate of the optical channel, the output of the modulator driver usually has the largest amplitude and highest bandwidth of any electrical signal in the system. The modulator also transfers any variation or imperfection in the amplified electrical waveform directly to the optical signal, and this distortion significantly affects the bit-error rate and thus the usable distance of the fiber optic link. These factors make the circuit design of the modulator driver especially critical.

The fundamental problem in MZ modulator driver design is obtaining high bandwidth (fast rise and fall times) with high pulse fidelity (damped response and low jitter) while using transistors large enough to handle the high voltage and current required to drive typical 50-ohm MZ modulators. At the present time, most MZ modulator drivers for bit rates of 10 Gb/s or more employ a distributed amplification principle (also known as a traveling wave amplifier—TWA); such an amplifier is shown in FIG. 1a. Here, the large transistor required to provide the high-amplitude output is split into a number of smaller transistor cells 10, which are interconnected using inductors or transmission lines 12. The smaller cells break up the input and output capacitances of the transistor, so that the inductors can quickly charge and discharge them in sequence (similar to a traveling wave in a transmission line) rather than all at once. This increases the circuit's bandwidth, but also greatly expands its physical size and results in limited integrability with other circuits. Moreover, TWA-based drivers have low electrical gain since they basically comprise a single (albeit large) transistor. Several cascaded TWA chips are thus required to provide enough amplification to form a practical driver, and each chip requires its own external components such as bias tees and dc-blocking/decoupling capacitors.

TWA-based drivers are predominantly built in a III–V field effect transistor (FET) technology such as gallium arsenide (GaAs) PHEMTs due to their combination of high speed and high breakdown voltage. The TWA architecture is also best suited to a device with purely capacitive input characteristics like an FET gate. The disadvantage of PHEMT devices is that their varying threshold voltage and conductance characteristics make them inappropriate for creating either high-precision analog or low-power digital control circuits. The result is that PHEMT-based modulator drivers generally require external (off-chip) control circuits to adjust their operation and keep their output stable over normal operating conditions like fluctuating temperature and supply voltage. These external circuits add considerable cost and complexity to the system.

For higher precision other driver architectures may be employed, such as the differential transistor pair with current source shown in FIG. 1b. In this approach, the large output transistors are "lumped" in one place rather than distributed as in the TWA. This has the advantage that the output amplitude may be precisely controlled through the use of a regulated current source. Bipolar transistors such as HBT devices are well suited to this configuration due to their high transconductance, uniform and well-modeled electrical characteristics, and compact size. To be suitable for MZ modulator applications, the transistors must be large enough to deliver current exceeding 100 milliamperes into load impedances of approximately 25 to 50 ohms while handling the resulting voltage swing, 6 volts p—p for example. Both pair transistors 14, 16 of this size will have significant parasitic capacitances ($C_p$) between their input and output. These capacitances, multiplied by the Miller effect that arises due to the inverting voltage gain in this common-emitter configuration, tend to reduce the stage's bandwidth and cause unacceptably slow rise time. This capacitance also degrades the output return loss of the driver, which leads to jitter when operating with an impedance-mismatched load. Accordingly, no examples have been found in the prior art of a high-speed single-ended MZ modulator driver (more than 6 volts p—p at 10 Gb/s or higher bit rate) using a lumped bipolar transistor output stage.

Some "lumped" amplifier architectures attempt to mitigate the problems associated with the use of larger transistors. One such approach is shown in FIG. 1c. Here, differential pair transistors 18 and 20 are cascoded with transistors 22 and 24, respectively. This lowers the impedance looking into the cascode transistors' emitters, reducing the Miller effect on the pair transistors and thereby improving the circuit's speed. However, this approach requires the use of four large devices, which can make the circuit layout difficult. In addition, the stacked transistors require a higher supply voltage, and thus the circuit consumes more DC power. Finally, the circuit's differential inputs require a differential pre-driver, which again requires more power.

SUMMARY OF THE INVENTION

A fast, high-swing driver circuit is presented which is particularly well-suited for driving electro-optical modulators. The circuit's output stage requires only two large transistors, yet provides a large voltage swing and the high speed needed to provide data rates of 10 Gb/s or more.

The present driver circuit includes an output stage which comprises first and second bipolar transistors arranged as a first differential pair and biased with a first current source.

The first transistor's collector is coupled to ground; the second transistor's collector is coupled to a supply voltage via a resistance and provides the driver circuit's output. A reference voltage is provided to the second transistor's base, and a capacitor is connected between the second transistor's base and ground such that the base is at AC ground.

When so arranged, the output stage amplifies an input signal applied to the first transistor's base, and provides the amplified signal at the driver circuit's output. Grounding the first transistor's collector and AC-coupling the second transistor's base to ground eliminates the Miller effects which would otherwise degrade the stage's speed. In addition, the second transistor's common-base configuration provides a higher breakdown voltage than prior art common-emitter output stages, without the higher supply voltage and the stacked devices found in the prior art cascode approach. Thus, the stage is capable of operating at high speeds with a large output voltage swing, making it well-suited for providing the 6–8 volt p—p, 10 Gb/s driving voltage required by an electro-optical modulator such as a single-ended Mach-Zehnder.

The present driver circuit also includes a third transistor and current source which form an emitter-follower stage that presents a low impedance to the first transistor's base; the base of the third transistor provides the driver circuit's input.

A complete electro-optical modulator driver is formed with the addition of a bias-T network at the driver circuit's output, a bias generator to provide the second transistor's base voltage, and a second differential pair which converts a differential input signal to a single-ended output that drives the emitter-follower stage.

Further features and advantages of the invention will be apparent to those skilled in the art from the following detailed description, taken together with the accompanying drawings.

DETAILED DESCRIPTION OF THE INVENTION

Figure 1A:
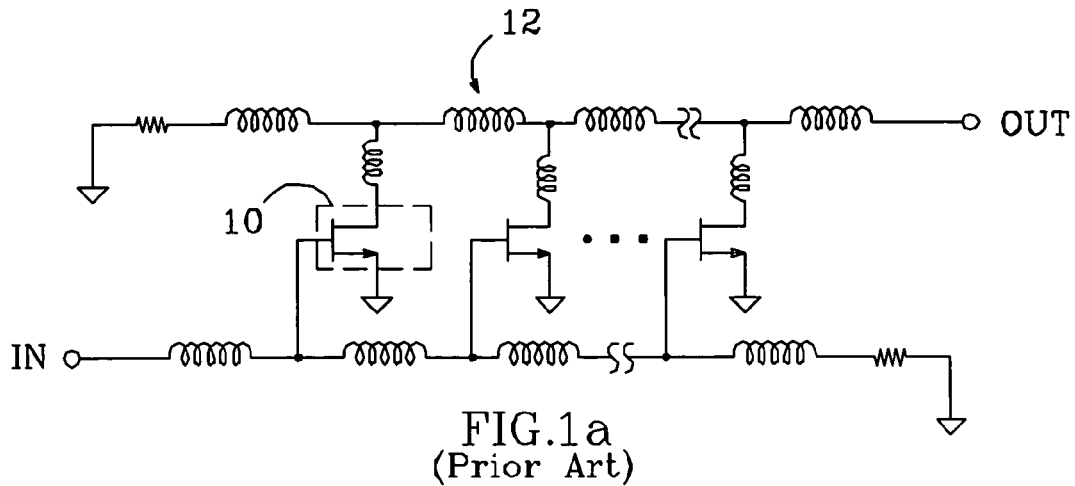
FIG. 1a is a schematic diagram of a known distributed amplifier.
Figure 1B:
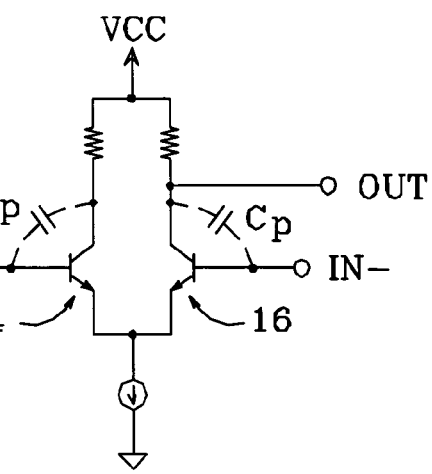
FIG. 1b is a schematic diagram of a known output stage.
Figure 1C:
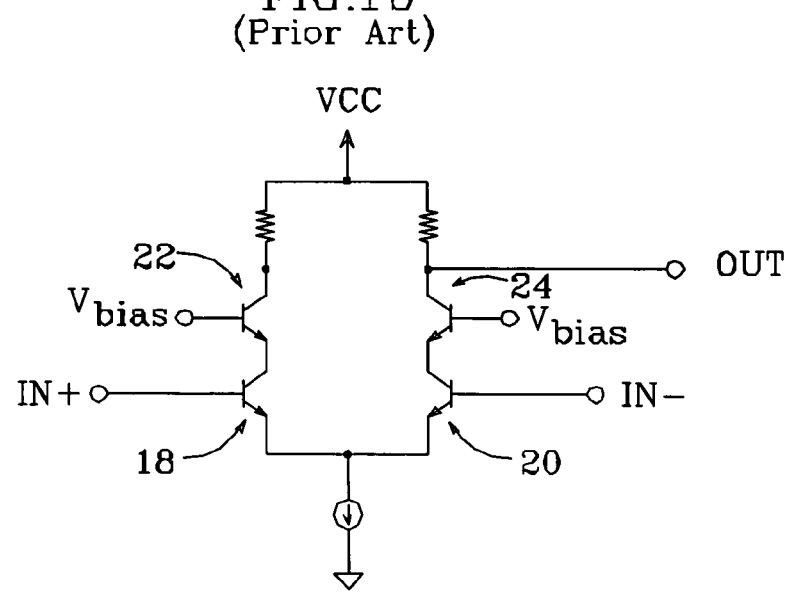
FIG. 1c is a schematic diagram of a known cascoded output stage.

The present invention is a driver circuit which includes an output stage capable of delivering a large output voltage swing at high speeds, making the driver circuit particularly well-suited for driving certain electro-optical modulators. The basic principles of a driver circuit in accordance with the present invention are illustrated in the schematic shown in FIG. 2. A circuit's output stage comprises a pair of bipolar transistors M1 and M2 arranged as a differential pair, with their emitters connected together at a common node 30 and a current source 32 connected between node 30 and a supply voltage (−5.2 volts in the example shown, though other voltages could also be used) which provides a bias current I1 to the differential pair. The base of transistor M1 provides an input terminal for the stage, and the collector of M2 provides the driver circuit's output The collector of input transistor M1 is coupled to ground, preferably via a diode 33 which serves to reduce the power dissipated in M1 by decreasing its collector voltage. This eliminates the Miller effect that M1 might otherwise be subject to, and allows M1 to respond quickly to changes at IN. The base of output transistor M2 is AC-coupled to ground via a capacitor 34, thereby providing it a low impedance to ground. This eliminates the Miller effect that M2 might otherwise be subject to, and thus allows M2 to respond quickly to changes at node 30. A DC reference voltage $V_{bias}$ is also applied to M2's base, and M2's collector is connected to a supply voltage (VCC in the example shown, though other voltages including ground could also be used) via a resistance R1 in series with an optional shunt-peaking inductor L2.

When so arranged, the output stage comprises a common collector stage (M1) driving a common base stage (M2), with the collector of M1 seeing a low impedance and the emitters of M1 and M2 each seeing a very low impedance. As a result, the present output stage provides a very fast current switch, with reference voltage $V_{bias}$ establishing the switching point; $V_{bias}$ is preferably selected to balance the stage between M1 and M2. When implemented with suitably fast transistors such as indium phosphide (InP) DHBT devices, the stage is capable of operating at data rates of 10 Gb/s or more, with a voltage swing adequate for MZ modulator applications. In operation, when the voltage applied to the base of M1 is less than $V_{bias}$, M1 is off, M2 is on, and OUT is pulled low. When greater than $V_{bias}$, M1 is turned on, M2 is turned off, and OUT is pulled up to VCC through R1.

In addition to the higher speed afforded by the output stage, the common-base configuration of M2 gives the stage a breakdown voltage characteristic which is higher than prior art common-emitter designs (since $BV_{cbo} > BV_{ceo}$) Furthermore, because the lumped output stage requires only two active devices, the circuit can have a compact layout and a well-controlled loadline. In addition, because there are no cascoded transistors, supply voltage VCC need not be as high as in prior art cascoded designs.

The present driver circuit further comprises a buffer stage made from a bipolar transistor M3, which is connected between an input terminal IN and the base of M1 and is biased with a current source 36; input terminal IN serves as the driver circuit's input. When arranged as shown, M3 serves as an emitter-follower circuit, the low impedance of which enables M1's input capacitance to be charged quickly. The driver circuit preferably also includes a bias-T network 40, connected between the collector of output transistor M2 and an output terminal OUT. The bias-T network typically includes a capacitor C1 which blocks DC current, and a large inductor or choke L1, which provides bias current to output transistor M2. The inductance of L1 is preferably large enough such that it looks like an open circuit for all frequencies of interest. Inductor L1 is preferably comprised of multiple physical inductors connected in series; for example, at least one large ferrite core inductor might be connected in series with a small conical RF coil connected to the collector of M2 so that high frequencies only see a physically small inductor—thereby reducing resonances.

Bias-T network 40 aids in providing a large output voltage swing to a load 42 connected to output terminal OUT and driven by the output stage; for an MZ modulator, load 42 is typically a resistance $R_L$ of 50 Ω. The L1 terminal opposite C1 is connected to a supply voltage such as +1.8 volts or +3.3 volts. When M2 is turned off (causing OUT to go high), L1 pulls the transient voltage at OUT above the +1.8 or +3.3 volt supply voltage, thereby enabling the output stage to provide a drive voltage on the order of 6–8 volt p—p as might be required for an electro-optical modulator such as an MZ, while using only standard low-voltage power supplies. Note that the output voltage swing is controlled precisely by the magnitude of bias current I1, with output voltage swing increasing with I1.

The present lumped output stage is more compact than a distributed amplifier, and is easily integrated. A complete driver including high-precision control circuits could be integrated on a single chip, using high speed indium phosphide (InP) DHBTs or silicon germanium (SiGe) HBTs, for example. The bias-T networks are typically located off-chip; as such, the present invention enables the positive supply voltage (e.g., +1.8 v/+3.3 v) to only be present on the output side, off-chip.

Resistance R1 preferably serves as a back termination resistor, which absorbs power reflected from the load being driven. This resistance can be connected to ground or to a supply voltage such as VCC: connection to ground is simplest, though if grounded, R1 draws DC current while absorbing reflected power, which represents a power loss. Connecting R1 to VCC eliminates this power loss, but requires the presence of supply voltage VCC. An inductor L2 can optionally be connected in series with R1, to serve as a shunt-peaking inductor which contributes a zero to the driver's frequency response, thereby increasing bandwidth and improving output return loss.

Figure 2:
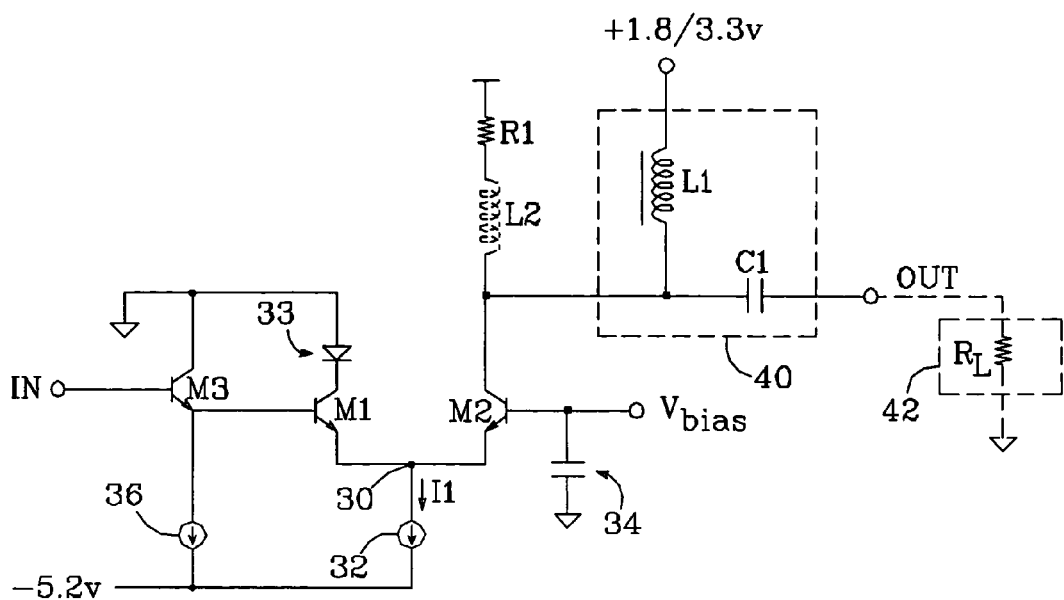
FIG. 2 is a schematic diagram of a driver circuit in accordance with the present invention.
Figure 3:
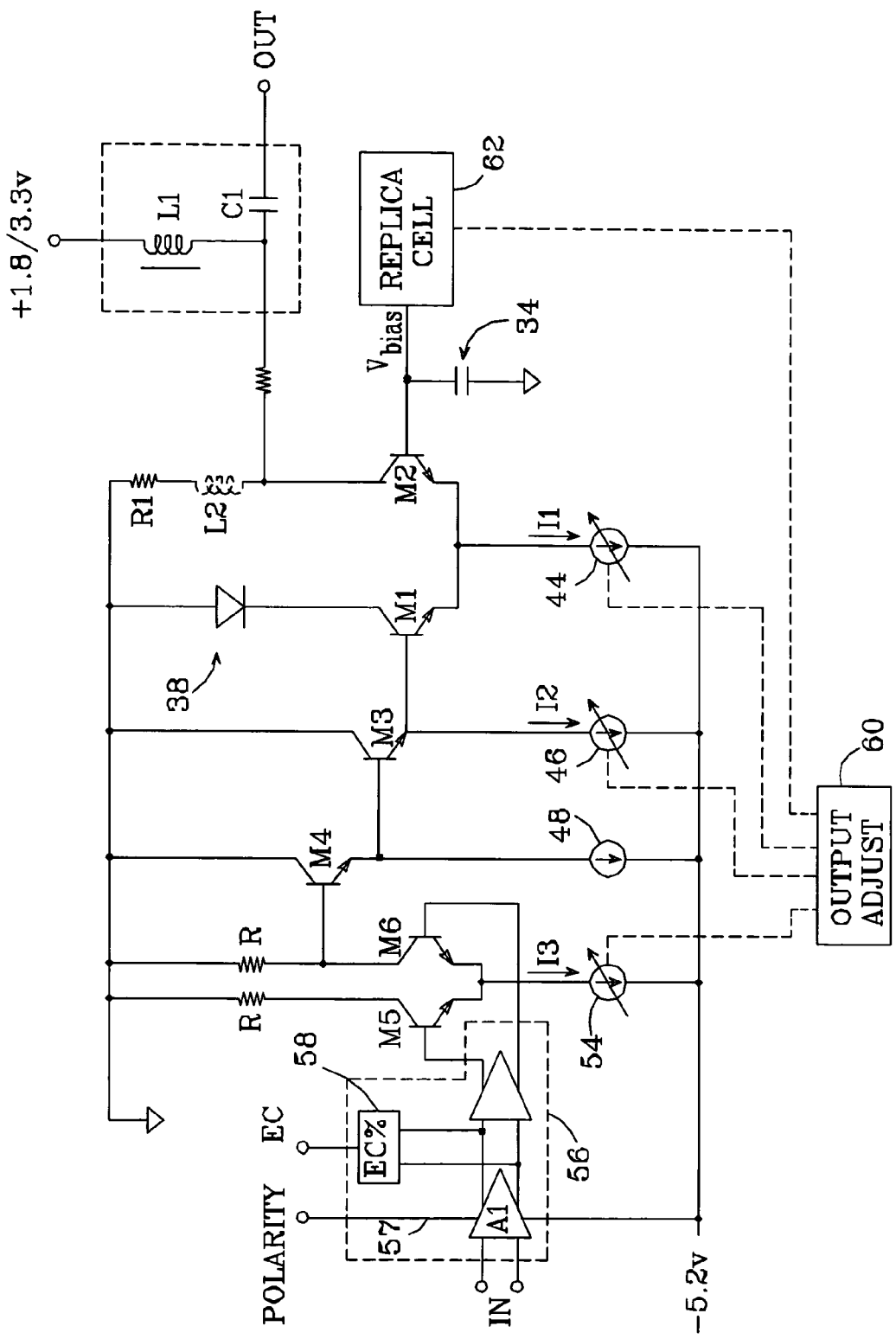
FIG. 3 is a schematic diagram of an electro-optical modulator driver which includes a driver circuit in accordance with the present invention.

An embodiment of a complete driver which includes the present driver circuit, suitable for driving an electro-optical modulator, is shown in FIG. 3. The driver is as shown in FIG. 2, except that here, the bias current sources 44 and 46 for M1/M2 and M3, respectively, are preferably adjustable; this is discussed below. The driver preferably includes another buffer stage made from a bipolar transistor M4 which drives the base of M3, and is biased with a current source 48. When arranged as shown, M4 serves as an emitter-follower circuit having a low impedance which enables M3's input capacitance to be charged quickly; M4's low output impedance is then further lowered with emitter-follower M3.

The driver also preferably includes a second differential pair made from bipolar transistors M5 and M6, which are biased with a current source 54 which is preferably adjustable. The collectors of M5 and M6 are connected to ground via respective resistances R, with one of the collectors (M6's collector in FIG. 3) connected to drive the base of emitter-follower M4. Differential pair transistors M5 and M6 receive a differential data signal at their respective base terminals, amplify it, and convert it to a single-ended signal. In this way, a small-amplitude (e.g., 200 mV p—p differential) high-speed (e.g., 10 Gb/s) digital data signal is applied to the bases of M5 and M6, converted to a single-ended signal, and amplified using the present output stage to provide a large amplitude (e.g., 6–8 v p—p single-ended) high-speed drive signal.

The driver may also include a multi-stage predriver 56 connected between the differential data signal and the bases of M5 and M6. Predriver 56 preferably includes a limiting amplifier A1 which conditions the differential data signal for the driver, by amplifying the differential data signal and outputting a differential signal of limited amplitude to M5 and M6, thereby improving the quality of the driver circuit's output. Predriver 56 may also include a polarity input 57 which controls the polarity of the predriver's output signals. An eye cross adjust circuit 58 may be connected to adjust the crossing point of the rising and falling edges of the driver's output waveform up or down as necessary to compensate for distortion in the electro-optic modulator or the optical transmission system.

The magnitude of the current (I1) provided by bias current source 44 is directly proportional to the driver circuit's output voltage swing. Current source 44 is preferably made adjustable so that the output swing can be set precisely to a desired level. Bias current sources 46 and 54 are also preferably made adjustable, and arranged such that their output currents (I2 and I3) rise and fall with I1; this tends to improve the driver circuit's pulse response and increases the range over which the output amplitude may be adjusted while preserving the shape of the pulse. The adjustable bias current sources are controlled by, for example, an output amplitude adjust control circuit 60. This control circuit may comprise one or more operational amplifiers fabricated with the same type of bipolar transistors used throughout the driver circuit. High-precision feedback loops, current mirrors and bandgap voltage references, well known in the bipolar circuit design art, may be readily employed. The control circuit preferably resides on the same die as the driver, so that the driver's output signal is inherently stabilized against variations in temperature and supply voltage. This eliminates the need for off-chip control circuits as encountered in the prior art of MZ modulator drivers.

The DC reference voltage $V_{ref}$ provided to the base of transistor M2 is preferably generated with a replica cell 62, which sets $V_{ref}$ to a value that balances the output stage such that M1 and M2 are on for approximately equal lengths of time when a 50%-duty-cycle input signal is applied. This is done by making $V_{ref}$ approximately equal to the DC bias voltage applied to the base of M1.

Figure 4:
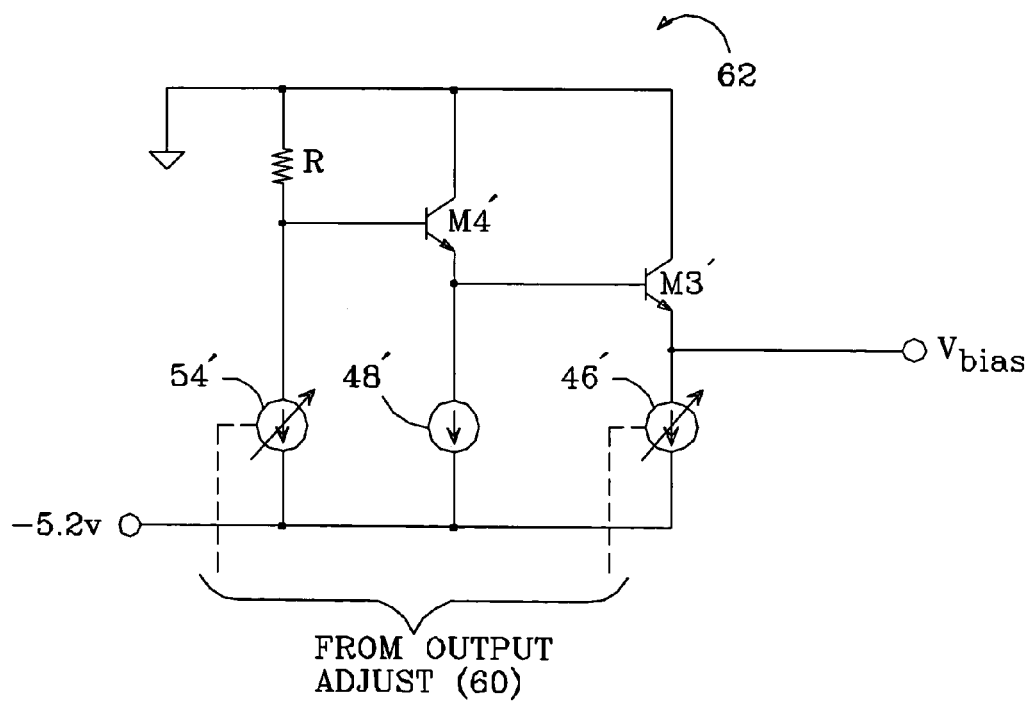
FIG. 4 is a schematic diagram of a replica cell as might be used with a driver circuit in accordance with the present invention.

Replica cell 62 accomplishes this by replicating the circuitry that drives M1. An exemplary embodiment of a suitable replica cell 62 is shown in FIG. 4. Transistors M3 and M4 are replicated with transistors M3' and M4', and biased with current sources 46' and 48', respectively (which replicate current sources 46 and 48). In the absence of an input signal, the DC voltage of the single-ended output produced by transistors M5 and M6 depends only on the current source 54 and the load R; as such, M5, M6 and current source 54 can be suitably replicated with just a resistor and a current source 54'. Current sources 46' and 48' are preferably made adjustable, and are controlled with the same control signals provided to current sources 46 and 48 by output amplitude adjust circuit 60.

When so arranged, replica cell output voltage $V_{ref}$ tracks the DC bias voltage applied to M1 and thereby keeps the output stage balanced. Replica cell transistors M3' and M4' are preferably fabricated on the same die as M3 and M4, so that $V_{ref}$ also tracks the DC bias voltage applied to M1 over temperature.

The replica cell's transistors are preferably much smaller than the transistors they replicate. M3' and M4' can be, for example, one-fourth the size of M3 and M4, and current sources 54', 48' and 46' arranged to produce currents one-fourth the size of those provided by 54, 48 and 46. This reduces the size required for the replica cell, as well as its current draw.

Another advantage provided by the present driver circuit's output stage concerns the physical layout which the output stage design makes possible. The stage enables a pure coplanar waveguide (CPW) layout, with signal currents flowing in minimum-inductance paths to and from the output line and the ground plane, and minimal transistor terminal overlap. An exemplary output stage layout is shown in the plan view depicted in FIG. 5. Transistor M1 is preferably made from a number of small transistors connected in parallel, with their emitters connected to a metal trace 68 that serves as node 30, their bases connected to another metal trace 70 that connects to the output of emitter-follower transistor M3, and their collectors connected to a metal ground plane layer 72 (or, alternatively, connected to ground plane 72 via diodes 73). Transistor M2 is preferably also made from a number of small transistors connected in parallel, with their emitters connected to metal trace 68, their bases connected to a terminal of capacitor 34, and their collectors connected to a metal trace 74 which serves as the output stage's output.

The layout is preferably made symmetrical. Thus, M1 and M2 comprise an even number of transistors, with half of M1's constituent transistors on either side of trace 30 and the constituent transistors of M2 equally divided on either side of trace 74. Similarly, capacitor 34 is preferably divided into halves 34a and 34b, with half the M2 transistors connected primarily to 34a and the other half primarily to 34b. Back termination resistor R1 is also preferably divided into two halves R1a and R1b which are interconnected via a metal trace 76, that connects to trace 74 using a via 79. Bias current source 32 is also preferably divided into halves 32a and 32b, which are interconnected via a metal trace 78 that connects to trace 68 using a via 80.

Typically, ground plane 72 and metal traces 68 and 74 would reside on one metal layer, and metal traces 70 and 78 would reside on another metal layer, with vias interconnecting the metal layers as necessary.

Arranging the output stage layout as described above provides several benefits. Signals flow primarily in a CPW mode, with balanced and oppositely-directed high frequency currents flowing in the output transistor manifolds and the adjacent ground plane. The balanced current flow and the layout's symmetry tend to minimize parasitic inductance, which in turn reduces losses and increases the stage's speed. The continuous ground plane makes the stage well-shielded, such that there is little interference with other circuits. The minimization of transistor terminal overlap reduces parasitic capacitance—which tends to increase the stage's speed while improving output return loss. Especially beneficial is the absence of any metal overlap between the base and collector terminals of transistor M2. In addition, the low impedance to ground required by M2's base terminal can be well-provided for by having capacitor 34a/34b large such that it takes advantage of the adjacent ground plane. Replica bias cell 62 may also be connected at the edge of this capacitor to provide the reference voltage for M2's base while decoupling the bias cell from the driver's high frequency response.

Figure 5:
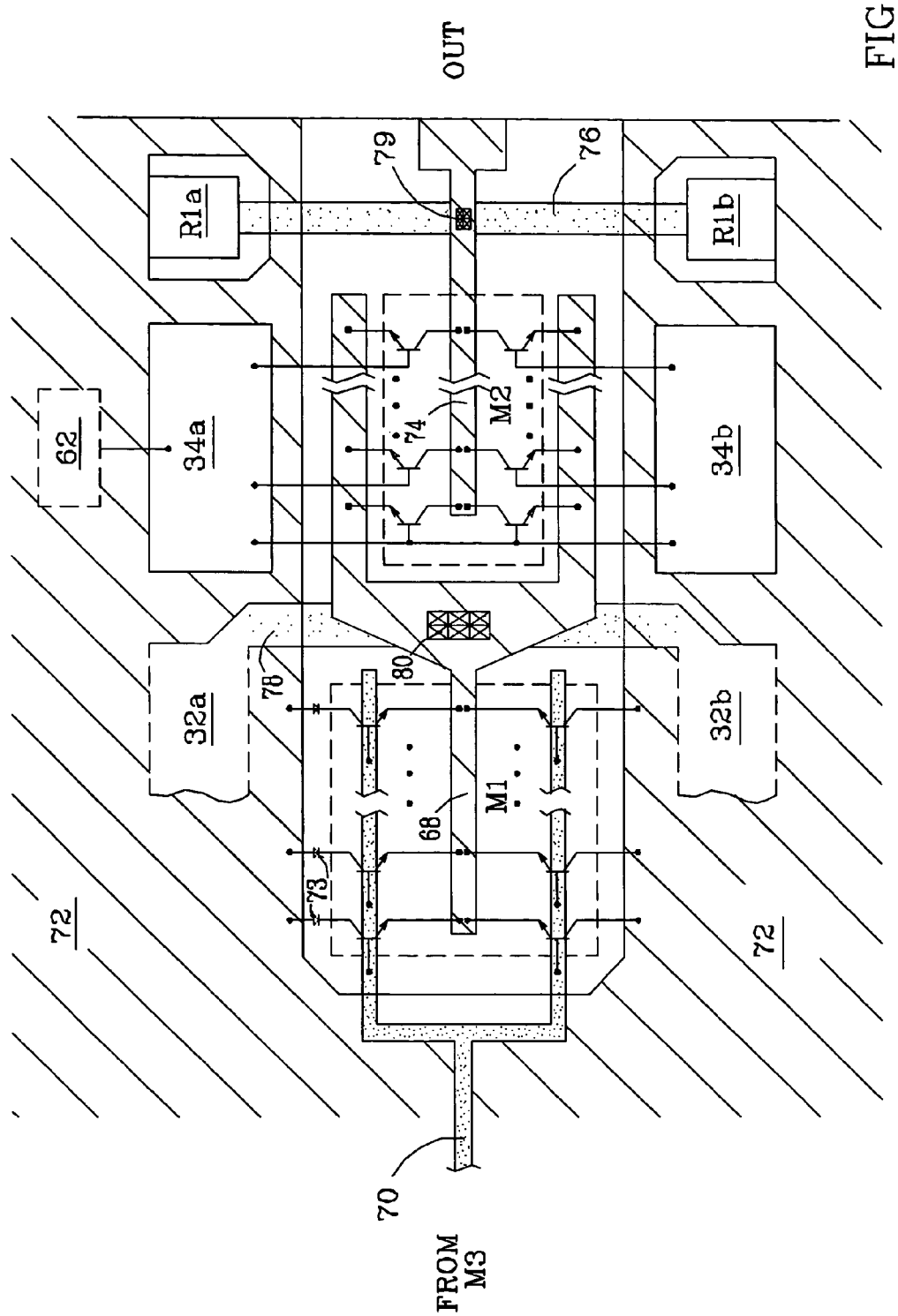
FIG. 5 is a plan view of an exemplary component layout such as might be used for the present invention.

Note that the output stage layout shown in FIG. 5 is merely exemplary; the invention also encompasses variations to the arrangement shown. For example, M1 and M2 may comprise additional banks of small constituent transistors, preferably arranged symmetrically about the signal paths in rows parallel to those depicted in FIG. 5.

As noted above, the present driver circuit is particularly well-suited for driving electro-optical modulators. However, the invention is not limited to use as a modulator driver. The driver circuit's high speed and large voltage swing enable it to be advantageously employed in numerous other applications—as, for example, a high speed pulse amplifier with a variable-amplitude output, or as a broadband variable-gain amplifier with linear phase response. In a communication system, the invention could be used to drive lasers or radio signal modulators, in addition to electro-optical modulators. In a radar system, the driver circuit could be used as a pulse generator or exciter for a higher power pulse amplifier. In the field of test and measurement equipment, the invention could be employed as an output driver for amplifying pulses or other broadband or high-frequency signals; or as a fast comparator circuit with high-swing output capability.

While particular embodiments of the invention have been shown and described, numerous variations and alternate embodiments will occur to those skilled in the art. Accordingly, it is intended that the invention be limited only in terms of the appended claims.

I claim:

1. A driver circuit suitable for use in an electro-optical modulator driver, comprising:
   an output stage, comprising:
      first and second bipolar transistors arranged as a first differential pair, the emitters of said transistors connected together at a first common node, said first transistor's collector coupled to ground;
      a first current source connected between said first common node and a first supply voltage which provides bias current to said first differential pair;
      said second transistor's collector coupled to a second supply voltage via an impedance and providing said driver circuit's output;
      a reference voltage provided to said second transistor's base; and
      a capacitor connected between said second transistor's base and ground such that said second transistor's base is at AC ground;
      such that said output stage amplifies an input signal applied to said first transistor's base and provides said amplified input signal at said driver circuit's output;
   a third bipolar transistor, the base of which provides said driver circuit's input and the emitter of which is connected to said first transistor's base; and
   a second current source connected between said third transistor's emitter and said first supply voltage which provides bias current to said third transistor, said third transistor and second current source forming an emitter-follower circuit which presents a low impedance to said first transistor's base.

2. The driver circuit of claim 1, wherein said first transistor's collector is coupled to ground via a diode.

3. The driver circuit of claim 1, further comprising a bias-T network having a DC input, a signal input and an AC output, said bias-T network connected at its signal input to said driver circuit's output and connected at its DC input to a supply voltage.

4. The driver circuit of claim 3, further comprising an electro-optical modulator connected at its electrical input to said bias-T network's AC output.

5. The driver circuit of claim 4, wherein said electro-optical modulator is a single-ended Mach-Zehnder modulator.

6. The driver circuit of claim 1; wherein said first current source is arranged such that its output current can be varied in response to a control signal to adjust the output voltage swing of said output stage's output.

7. The driver circuit of claim 1, further comprising:
   a fourth bipolar transistor, the emitter of which is connected to said third transistor's base; and a third current source connected between said fourth transistor's emitter and said first supply voltage which provides bias current to said fourth transistor, said fourth transistor and third current source forming an emitter-follower circuit which presents a low impedance to said third transistor's base;

fifth and sixth bipolar transistors arranged as a second differential pair, the emitters of said fifth and sixth transistors connected together at a second common node; and a fourth current source connected between said second common node and said first supply voltage which provides bias current to said second differential pair, the collectors of said fifth and sixth transistors coupled to ground via respective resistances and the base of said fourth transistor connected to the collector of one of said fifth and sixth transistors to form a driver stage, the bases of said fifth and sixth transistors providing differential inputs for said driver stage.

8. The driver circuit of claim 7, wherein said first current source is arranged such that its output current can be varied in response to a control signal to adjust the output voltage swing of said driver circuit's output, and at least one of said second and fourth current sources is arranged such that their output currents vary with the output current of said first current source.

9. The driver circuit of claim 7, further comprising a reference voltage generator circuit which provides said reference voltage to said second transistor's base, said reference voltage generator circuit arranged to replicate the DC bias voltage provided to the base of said first transistor and to provide said replicated voltage as said reference voltage.

10. The driver circuit of claim 9, wherein said reference voltage generator circuit comprises:

a resistor connected between ground and a third common node;

a fifth current source connected between said third common node and said first supply voltage;

a ninth bipolar transistor, the base of which is connected to said third common node;

a sixth current source connected between said ninth transistor's emitter and said first supply voltage which provides bias current to said ninth transistor, said ninth transistor and sixth current source forming an emitter-follower circuit;

a tenth bipolar transistor, the base of which is connected to the emitter of said ninth transistor; and a seventh current source connected between said tenth transistor's emitter and said first supply voltage which provides bias current to said tenth transistor, said tenth transistor and seventh current source forming an emitter-follower circuit, the emitter of said tenth bipolar transistor providing said reference voltage.

11. The output stage of claim 10, wherein said tenth and ninth bipolar transistors are scaled with respect to said third and fourth transistors, respectively, and said fifth and seventh current sources are scaled with respect to said fourth and second current sources, respectively.

12. The output stage of claim 1, wherein said impedance comprises a resistance which provides a back termination resistance for a load driven by said output stage.

13. The output stage of claim 12, wherein said impedance further comprises a shunt-peaking inductor connected in series with said resistance.

14. The output stage of claim 1, wherein said output stage is fabricated on a coplanar waveguide (CPW) layout, comprising:

a plurality of signal paths;

a ground plane electrically isolated from and surrounding said signal paths and forming a coplanar waveguide (CPW) with said signal paths;

wherein said first transistor comprises a plurality of transistors connected in parallel, with their bases connected to a first signal path, their emitters connected to a second signal path, and their collectors coupled to said ground plane, said first transistor's constituent transistors arranged symmetrically about said second signal path; and said second transistor comprises a plurality of transistors connected in parallel, with their bases connected to said capacitor, their emitters connected to said second signal path, and their collectors connected to a third signal path, said second transistor's constituent transistors arranged symmetrically about said third signal path.

15. The output stage of claim 14, wherein said capacitor is divided into two halves which are arranged symmetrically about said third signal path, and said resistance is provided by a resistor divided into two halves which are arranged symmetrically about said third signal path.

16. The output stage of claim 14, wherein said second transistor's constituent transistors are arranged such that none of their collector terminals overlaps any of their base terminals.

17. A electro-optical modulator driver, comprising:

first and second bipolar transistors (M5,M6) arranged as a first differential pair, the emitters of said first and second transistors connected together at a first common node;

a first current source (54) connected between said first common node and a first supply voltage which provides bias current to said first differential pair, the collectors of said first and second transistors coupled to ground via respective resistances, the bases of said first and second transistors providing differential inputs for said driver circuit;

a third bipolar transistor (M4) having its base connected to the collector of one of said first and second transistors;

a second current source (48) connected between said third transistor's emitter and said first supply voltage which provides bias current to said third transistor, said third transistor and second current source forming an emitter-follower circuit;

a fourth bipolar transistor (M3), the base of which is connected to the emitter of said third transistor;

a third current source (46) connected between said fourth transistor's emitter and said first supply voltage which provides bias current to said fourth transistor, said fourth transistor and third current source forming an emitter-follower circuit;

fifth and sixth bipolar transistors (M1,M2) arranged as a second differential pair, the emitters of said transistors connected together at a second common node;

a fourth current source (44) connected between said second common node and said first supply voltage which provides bias current to said first differential pair;

said fifth transistor's collector coupled to ground via a diode (38) and said fifth transistor's base connected to the emitter of said fourth transistor;

said sixth transistor's collector coupled to a supply voltage via a resistance;

a reference voltage provided to said sixth transistor's base;

a capacitor connected between said sixth transistor's base and ground such that said sixth transistor's base is at AC ground; and a bias-T network having a DC input, a signal input and an AC output, said bias-T network connected at its signal input to said sixth transistor's collector and connected at its DC input to a supply voltage, said bias-T network's AC output providing said driver circuit's output;

such that said driver circuit amplifies a differential input signal applied to said differential inputs and provides said amplified input signal as a single-ended output signal at said driver-circuit's output.

18. The driver of claim 17, further comprising an electro-optical modulator connected at its electrical input to said bias-T network's AC output.

19. The driver of claim 18, wherein said electro-optical modulator is a single-ended Mach-Zehnder modulator.

20. The driver of claim 17, wherein said fourth current source is arranged such that its output current can be varied in response to a control signal to adjust the output voltage swing of said driver circuit's output.

21. The driver circuit of claim 17, further comprising a reference voltage generator circuit which provides said reference voltage to said sixth transistor's base, said reference voltage generator circuit arranged to replicate the DC bias voltage provided to the base of said fifth transistor and to provide said replicated voltage as said reference voltage.

22. The driver circuit of claim 17, wherein said resistance provides a back termination resistance for the load driven by said output stage.

* * * * *